(12) United States Patent
Lin (10) Patent No.: US 10,326,429 B1
(45) Date of Patent: Jun. 18, 2019

(54) RECEIVER AND COMMON-MODE VOLTAGE CALIBRATION METHOD THEREOF

(71) Applicant: Faraday Technology Corp., Hsinchu (TW)

(72) Inventor: Ming-Chi Lin, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/053,814

(22) Filed: Aug. 3, 2018

(30) Foreign Application Priority Data

May 17, 2018 (TW) .............................. 107116697 A (51) Int. Cl.
*H03K 5/24* (2006.01)
*H03K 3/011* (2006.01)

(52) U.S. Cl.
CPC ............... *H03K 3/011* (2013.01); *H03K 5/24* (2013.01); *H03F 2200/78* (2013.01)

(58) Field of Classification Search
CPC ....... H03K 3/011; H03K 5/24; H03F 2200/78
USPC .......................................................... 327/3
See application file for complete search history.

(56) References Cited

U.S. PATENT DOCUMENTS

| | | | | |
|---|---|---|---|---|
| 8,729,891 | B2 * | 5/2014 | Stephanson | G01R 33/10 324/228 |
| 9,983,240 | B2 * | 5/2018 | Roberts | G01R 19/32 |
| 2017/0063361 | A1 | 3/2017 | Jenkins et al. | |

* cited by examiner

*Primary Examiner* — Dinh T Le
(74) *Attorney, Agent, or Firm* — Winston Hsu (57) ABSTRACT

A receiver and a common-mode voltage calibration method thereof are provided. The receiver includes sensing circuits, a phase comparator, and a self-calibration circuit. The phase comparator compares phase relationships of the latch results at the output terminals of the sensing circuits during a testing period to produce a phase comparison result. During the testing period, the self-calibration circuit provides the same differential signal to the input terminals of these sensing circuits, and sets common-mode levels at the input terminals of these sensing circuits to be different from one another. The self-calibration circuit determines a calibrated common-mode level based on the phase comparison result. The self-calibration circuit sets the common-mode levels at the input terminals of these sensing circuits to be equal to the calibrated common-mode level during a normal operation period.

8 Claims, 5 Drawing Sheets

RECEIVER AND COMMON-MODE VOLTAGE CALIBRATION METHOD THEREOF

CROSS-REFERENCE TO RELATED APPLICATION

This application claims the priority benefit of Taiwan application serial no. 107116697, filed on May 17, 2018. The entirety of the above-mentioned patent application is hereby incorporated by reference herein and made a part of this specification.

BACKGROUND

Technical Field

The disclosure relates to an electronic device and particularly relates to a receiver and a common-mode voltage calibration method thereof.

Description of Related Art

Figure 1:
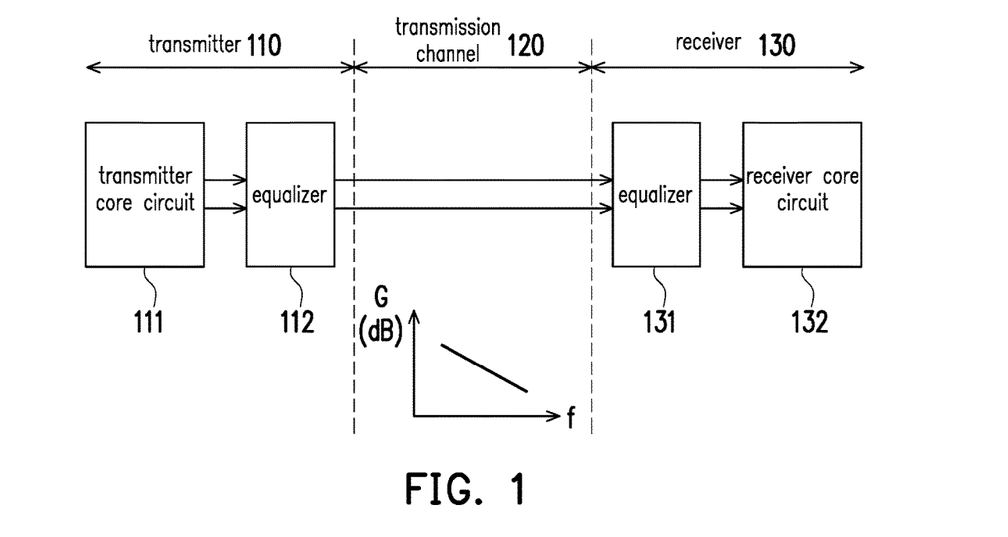
FIG. 1 is a circuit block diagram illustrating a signal transmission system.

During the process of signal transmission, signals tend to suffer considerable loss in the transmission channel. Consequently, an equalizer circuit for compensating the loss is provided at the transmitter and/or the receiver. For example, FIG. 1 is a circuit block diagram illustrating a signal transmission system. In the scenario shown in FIG. 1, a differential signal output by a transmitter 110 is transmitted to a receiver 130 through a transmission channel 120. During the process of signal transmission, the signal suffers considerable loss in the transmission channel 120. For example, the characteristic curve of a gain G versus a frequency f in the transmission channel 120 as shown in FIG. 1 shows that the gain G of the signal in the transmission channel 120 decreases as the frequency f increases.

Generally speaking, after the signal passes through the transmission channel 120, the signal strength may be attenuated. A signal strength that is too weak results in too much jitter, thereby causing an increase in the code error rate of transmission and affecting the quality of communication. Accordingly, an equalizer 112 for compensating the loss may be provided at the transmitter 110 to gain a high frequency part of a differential signal output by a transmitter core circuit 111. Similarly, an equalizer 131 for compensating the loss may be provided at the receiver 130 to gain a high frequency part of a differential signal coming from the transmission channel 120 and to transmit the equalized differential signal to a receiver core circuit 132. In general, the receiver core circuit 132 may include a slicer.

The equalizer 131 may be a decision feedback equalizer (DFE) or another kind of equalizer. The equalizer 131 and the receiver core circuit 132 have a number of sensing circuits (e.g., a sense amplifier). These sensing circuits may latch and gain differential signals at the input terminals thereof and may output latch results to the next-stage circuits. In general, latch speeds of the sensing circuits are affected by factors such as the manufacturing process and temperature. The latch speed may be defined as a delay time from when the clock is activated until the latch result is produced. The shorter the delay time, the faster the latch speed of the sensing circuit. As required by high-speed transmission applications, the faster the latch speed of the sensing circuit is, the better.

SUMMARY

The disclosure provides a receiver and a common-mode voltage calibration method thereof for accelerating latch speeds of sensing circuits.

A receiver is provided by the embodiments of the disclosure. The receiver includes a plurality of sensing circuits, a phase comparator and a self-calibration circuit. The phase comparator is coupled to a plurality of output terminals of the plurality of sensing circuits to receive a plurality of latch results. The phase comparator compares phase relationships of the plurality of latch results during a testing period to produce a phase comparison result. The self-calibration circuit is coupled to the phase comparator to receive the phase comparison result and is coupled to a plurality of input terminals of the plurality of sensing circuits. The self-calibration circuit provides the same differential signal to the plurality of input terminals of the plurality of sensing circuits during the testing period and sets common-mode levels at the plurality of input terminals of the plurality of sensing circuits to be different from one another. The self-calibration circuit determines a calibrated common-mode level based on the phase comparison result. The self-calibration circuit sets the common-mode levels at the plurality of input terminals of the plurality of sensing circuits to be equal to the calibrated common-mode level during a normal operation period.

A common-mode voltage calibration method of a receiver is provided by the embodiments of the disclosure, and herein the receiver includes a plurality of sensing circuits, a self-calibration circuit and a phase comparator. The common-mode voltage calibration method in one of the exemplary embodiments is provided hereafter. Phase relationships of a plurality of latch results at a plurality of output terminals of the plurality of sensing circuits are compared by the phase comparator during a testing period to produce a phase comparison result. The same differential signal is provided to a plurality of input terminals of the plurality of sensing circuits by the self-calibration circuit during the testing period. Common-mode levels at the plurality of input terminals of the plurality of sensing circuits are set to be different from one another by the self-calibration circuit during the testing period. A calibrated common-mode level is determined based on the phase comparison result by the self-calibration circuit. The common-mode levels at the plurality of input terminals of the plurality of sensing circuits are set to be equal to the calibrated common-mode level by the self-calibration circuit during a normal operation period.

Based on the foregoing, in the receiver and the common-mode voltage calibration method thereof according to the embodiments of the disclosure, different common-mode levels are used during the testing period to test the plurality of sensing circuits so as to select one common-mode level (referred to as the calibrated common-mode level) among the different common-mode levels. During the normal operation period, the receiver sets the common-mode levels of the sensing circuits to be equal to the calibrated common-mode level so as to accelerate the latch speeds of the sensing circuits.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The term "couple (or connect)" used throughout this specification (including the claims) may refer to any direct or indirect connection means. For example, if it is described that the first device is coupled (or connected) to the second device, it should be understood that the first device may be directly connected to the second device or indirectly connected to the second device through other devices or certain connection means. Moreover, elements/components/steps with the same reference numerals represent the same or similar parts in the figures and embodiments where appropriate. Descriptions of the elements/components/steps with the same reference numerals or terms in different embodiments may be references for one another.

Figure 2:
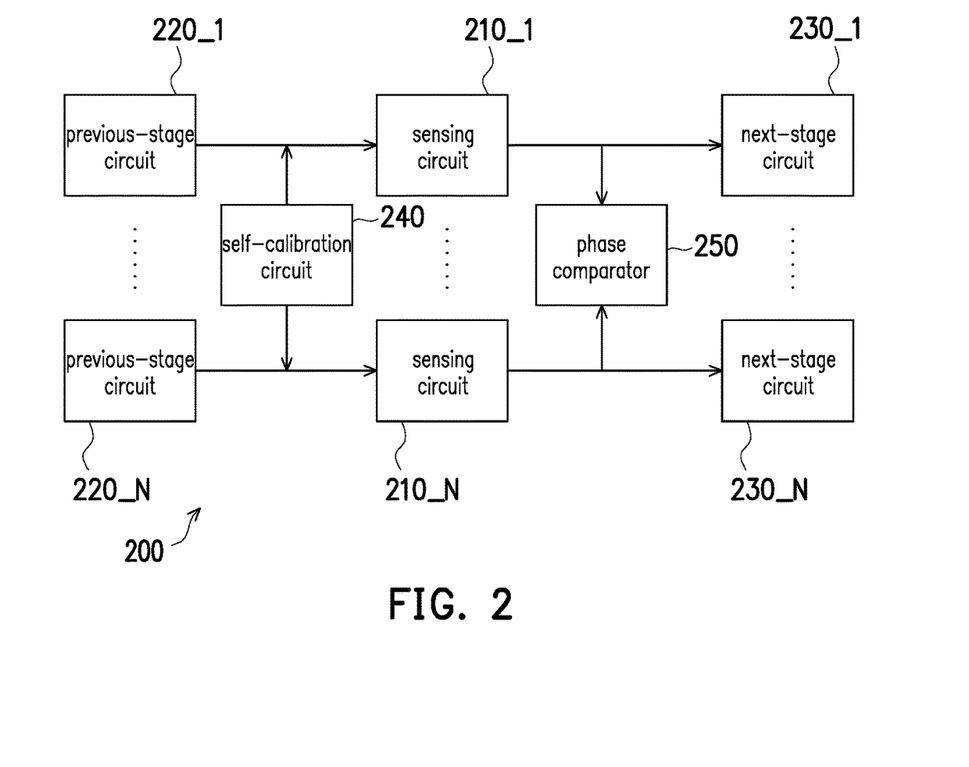
FIG. 2 is a circuit block diagram of a receiver according to an embodiment of the disclosure.

FIG. 2 is a circuit block diagram of a receiver 200 according to an embodiment of the disclosure. A differential signal output by a transmitter (not shown) is transmitted to the receiver 200 through a transmission channel. The receiver 200 may gain a high frequency part of the differential signal coming from the transmission channel. In general, the receiver 200 may include a sense amplifier, a latch, an equalizer and/or a slicer. In the embodiment shown in FIG. 2, the receiver 200 includes N sensing circuits 210_1, . . . , 201_N, wherein N may be determined according to design requirements. The sensing circuits 210_1 to 201_N as shown in FIG. 2 may represent sensing devices within the sense amplifier, latch, equalizer, slicer and/or other components of the receiver 200.

Each of the sensing circuits 210_1 to 201_N has a differential input terminal to receive a differential signal from a previous-stage circuit. Each of the sensing circuits 210_1 to 210_N latches the differential signal, and outputs the latch result to a next-stage circuit. For example, the sensing circuit 210_1 receives a differential signal from a previous-stage circuit 220_1, and outputs the latch result to a next-stage circuit 230_1. By analogy, the sensing circuit 210_N receives a differential signal from a previous-stage circuit 220_N, and outputs the latch result to a next-stage circuit 230_N. This embodiment does not impose limitations on the implementation methods of the sensing circuits 210_1 to 210_N. According to design requirements, in some embodiments, the sensing circuits 210_1 to 210_N may be conventional differential amplifiers, conventional error amplifiers, or other amplifier devices/circuits. In some other embodiments, the sensing circuits 210_1 to 210_N may be conventional latches or other differential data latch devices/circuits.

Figure 3:
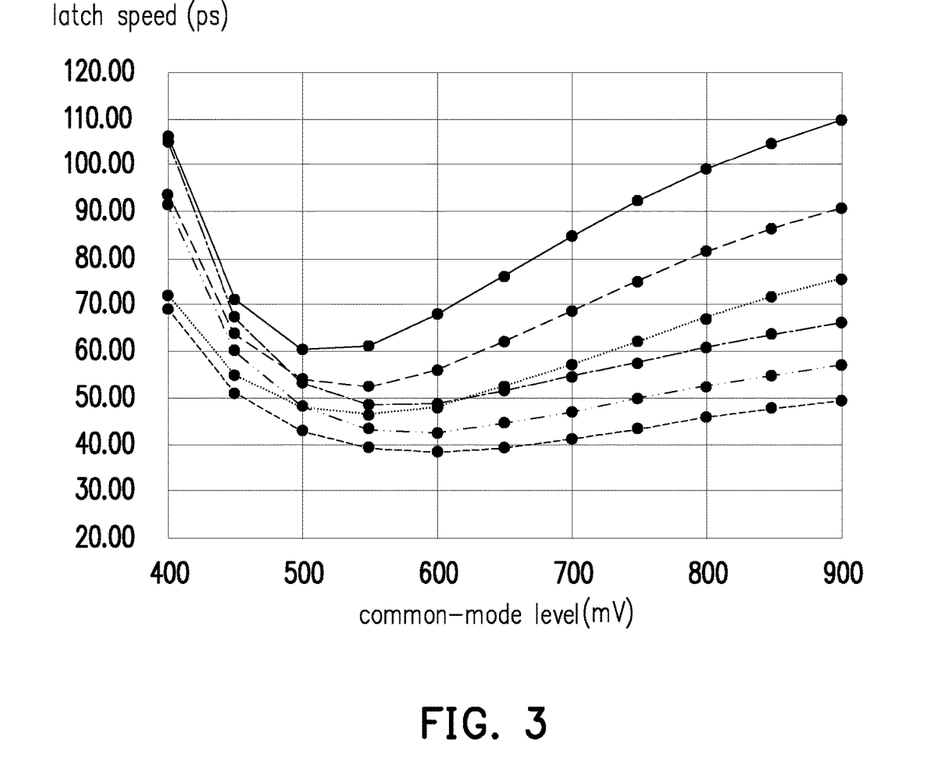
FIG. 3 schematically shows characteristic curves of latch speed versus common-mode level of the sensing circuit in FIG. 2 according to an embodiment of the disclosure.

FIG. 3 schematically shows characteristic curves of latch speed versus common-mode level of the sensing circuit 210_1 in FIG. 2 according to an embodiment of the disclosure. The rest of the sensing circuits in FIG. 2 (e.g., the sensing circuit 210_N) may be inferred from the related description of the sensing circuit 210_1, so details thereof are omitted here. The horizontal axis of FIG. 3 represents the level of common-mode voltage (i.e., the common-mode level) at the input terminal of the sensing circuit 210_1, and the unit thereof is millivolt (mV). The vertical axis of FIG. 3 represents the latch speed of the sensing circuit 210_1, and the unit thereof is picosecond (ps). The latch speed may be defined as a delay time from when the clock is activated until the latch result is produced. The shorter the delay time, the faster the latch speed of the sensing circuit 210_1. As required by high-speed transmission applications, the faster the latch speed of the sensing circuit 210_1 is, the better.

The latch speed of the sensing circuit is also affected by the level of the common-mode voltage (i.e., the common-mode level). The plurality of curves in FIG. 3 illustrate the characteristics of the sensing circuit 210_1 when operating at different voltages. As shown by the characteristic curves of FIG. 3, the relationship between the common-mode level of the sensing circuit 210_1 and the latch speed of the sensing circuit 210_1 is not a simple linear relationship. When the common-mode level of the sensing circuit 210_1 is set to be a specific level, the latch speed of the sensing circuit 210_1 is the fastest. However, the "specific level" is often influenced by processing factors and/or other factors, so the "specific level" may not be easily known/determined at the IC design stage.

Figure 4:
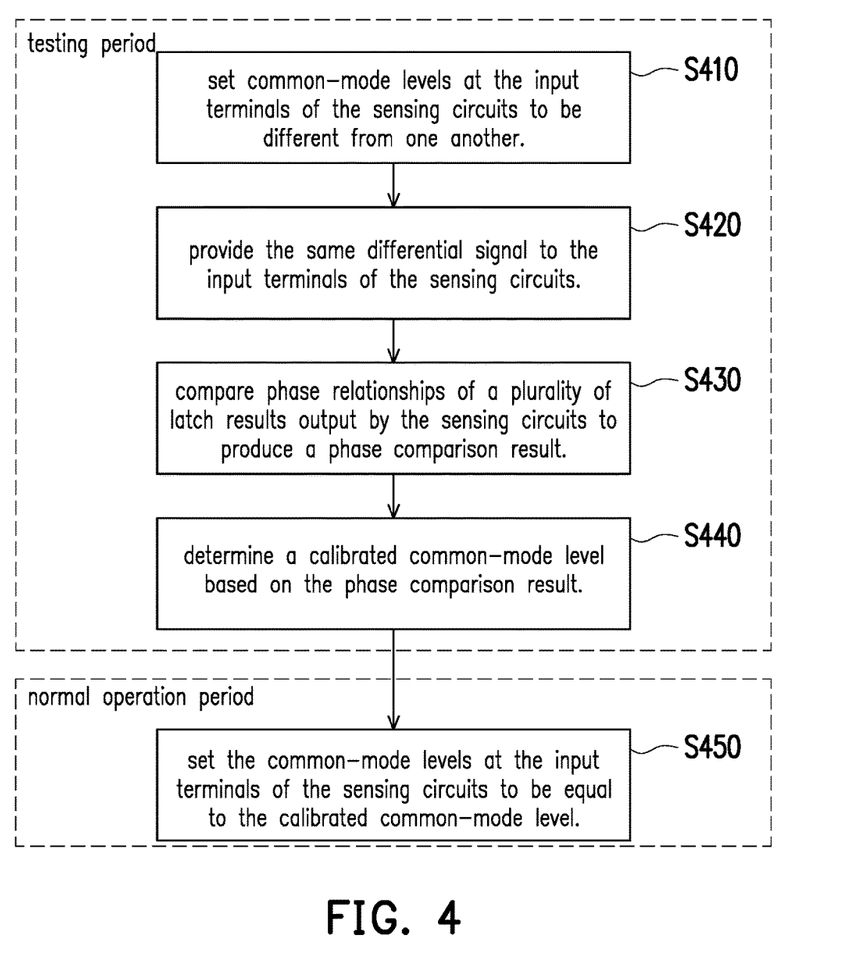
FIG. 4 is a flowchart schematically showing a common-mode voltage calibration method of a receiver according to an embodiment of the disclosure.

FIG. 4 is a flowchart schematically showing a common-mode voltage calibration method of a receiver according to an embodiment of the disclosure. With reference to FIG. 2 and FIG. 4, a receiver 200 includes a plurality of sensing circuits 210_1 to 210_N, a self-calibration circuit 240 and a phase comparator 250. Steps S410 to S430 in FIG. 4 are performed during a testing period of the receiver 200, and step S450 is performed during a normal operation period of the receiver 200. Step S440 in FIG. 4 may be performed during the testing period of the receiver 200. However, in other embodiments, step S440 may be performed after the end of the testing period and before the entry into the normal operation period. In yet some other embodiments, step S440 may be performed during the normal operation period of the receiver 200.

The self-calibration circuit 240 is coupled to the input terminals of the sensing circuits 210_1 to 210_N. The phase comparator 250 is coupled to the output terminals of the sensing circuits 210_1 to 210_N to receive a plurality of latch results. During the testing period, the self-calibration circuit 240 is enabled to provide a differential signal to the input terminals of the sensing circuits 210_1 to 210_N, and the phase comparator 250 is enabled to receive the latch results at the output terminals of the sensing circuits 210_1 to 210_N. During the normal operation period, the self-calibration circuit 240 and the phase comparator 250 are disabled. At this time, the input terminals of the sensing circuits 210_1 to 210_N receive differential signals output by previous-stage circuits 220_1 to 220_N, and the output terminals of the sensing circuits 210_1 to 210_N output the latch results to next-stage circuits 230_1 to 230_N.

In step S410, the self-calibration circuit 240 sets the levels of the common-mode voltages (i.e., the common-mode levels) at the input terminals of the sensing circuits 210_1 to 210_N to be different from one another during the testing period. In step S420, the self-calibration circuit 240 provides the same differential signal to the input terminals of the sensing circuits 210_1 to 210_N during the testing period. In light of the related description of FIG. 3, it is known that the sensing circuits 210_1 to 210_N may have different latch speeds as a result of the different common-mode levels. The sensing circuits 210_1 to 210_N each latch the same differential signal provided by the self-calibration circuit 240, and output the latch results at different latch speeds respectively.

In step S430, the phase comparator 250 compares phase relationships of the latch results at the output terminals of the sensing circuits 210_1 to 210_N during the testing period to produce a phase comparison result. The self-calibration circuit 240 is further coupled to the phase comparator 250 to receive the phase comparison result. In step S440, the self-calibration circuit 240 determines a calibrated common-mode level based on the phase comparison result of the phase comparator 250. For example, the self-calibration circuit 240 may set different common-mode levels at the input terminals of the sensing circuits 210_1 to 210_N based on a common-mode level list, and select one common-mode level from the common-mode level list based on the phase comparison result to serve as the calibrated common-mode level. In some embodiments, the self-calibration circuit 240 may apply (set) a plurality of common-mode levels in the common-mode level list to the input terminals of the sensing circuits 210_1 to 210_N by turns, so that a common-mode level having the fastest latch speed is located among the common-mode levels in the common-mode level list to serve as the calibrated common-mode level.

In step S450, the self-calibration circuit 240 sets the common-mode levels at the input terminals of the sensing circuits 210_1 to 210_N to be equal to the calibrated common-mode level during the normal operation period. Therefore, the self-calibration circuit 240 may adaptively and dynamically tune the latch speeds of the sensing circuits 210_1 to 210_N to an optimal state.

Figure 5:
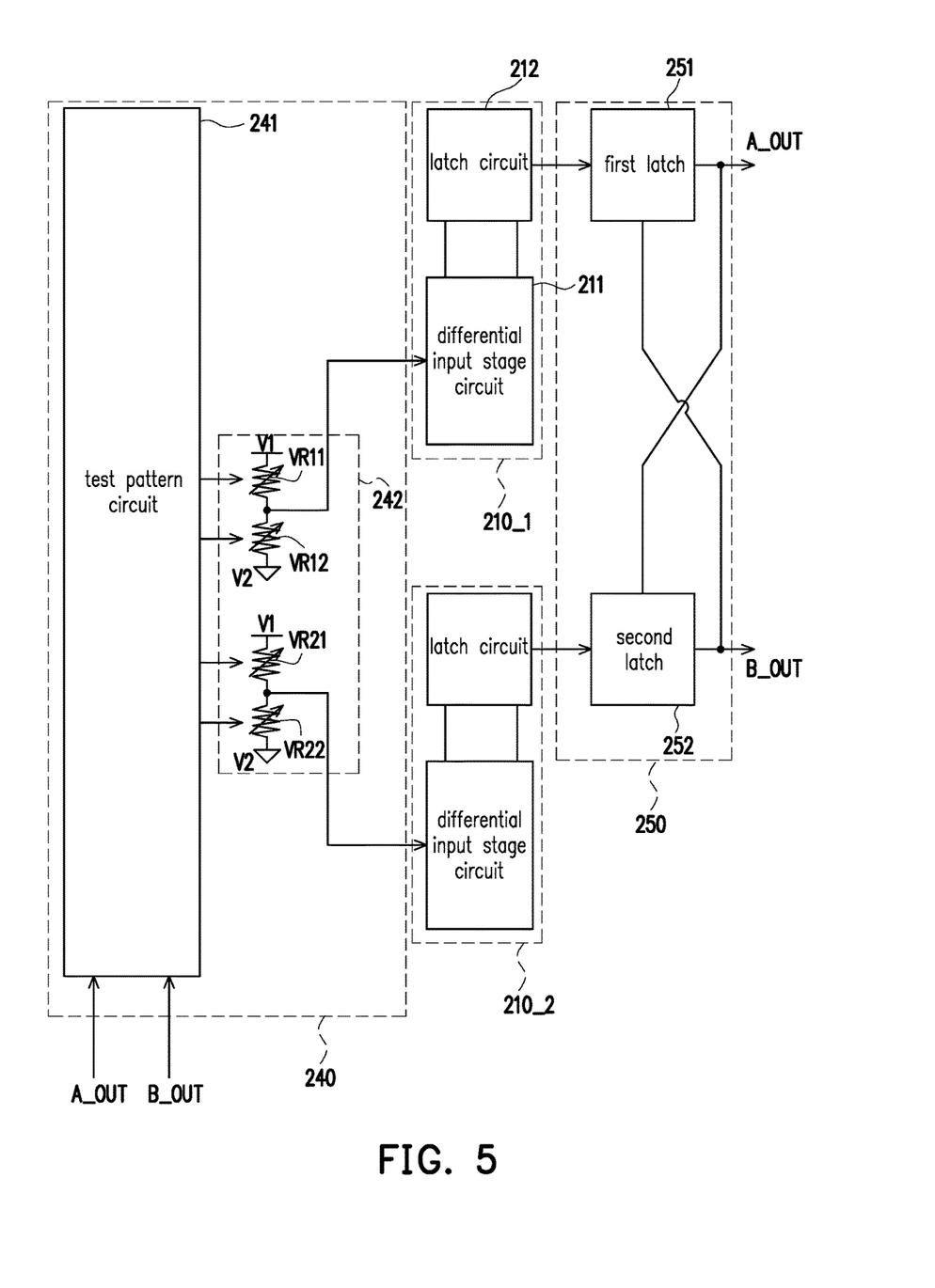
FIG. 5 is a circuit block diagram showing the self-calibration circuit and the phase comparator of FIG. 2 according to an embodiment of the disclosure.

FIG. 5 is a circuit block diagram showing the self-calibration circuit 240 and the phase comparator 250 of FIG. 2 according to an embodiment of the disclosure. In the embodiment shown in FIG. 5, the number N of the sensing circuits 210_1 to 210_N is assumed to be two. However, the description of FIG. 5 may be applied to three sensing circuits or more. The sensing circuits 210_1 and 210_2 in FIG. 5 may be inferred from the related descriptions of the sensing circuits 210_1 to 210_N in FIGS. 2-4, so details thereof are omitted here.

In the embodiment shown in FIG. 5, the sensing circuit 210_1 includes a differential input stage circuit 211 and a latch circuit 212. The differential input terminal of the differential input stage circuit 211 serves as an input terminal of the sensing circuit 210_1 to receive a differential signal from the self-calibration circuit 240. At least one input terminal of the latch circuit 212 is coupled to at least one output terminal of the differential input stage circuit 211. At least one output terminal of the latch circuit 212 serves as an output terminal of the sensing circuit 210_1 to output the latch result to the phase comparator 250. According to design requirements, the differential input stage circuit 211 may be any type of differential input stage circuit, and the latch circuit 212 may be any type of latch circuit. For example, the differential input stage circuit 211 may be a conventional differential input stage circuit or another kind of differential input stage circuit, and the latch circuit 212 may be a conventional latch circuit or another kind of latch circuit. The sensing circuit 210_2 in FIG. 5 may be inferred from the related description of the sensing circuit 210_1, so details thereof are omitted here.

In the embodiment shown in FIG. 5, the phase comparator 250 includes a first latch 251 and a second latch 252. The input terminal of the first latch 251 is coupled to the output terminal of the sensing circuit 210_1 to receive the latch result of the sensing circuit 210_1. The input terminal of the second latch 252 is coupled to the output terminal of the sensing circuit 210_2 to receive the latch result of the sensing circuit 210_2. According to design requirements, the first latch 251 and the second latch 252 may be any types of latch circuits. For example, the first latch 251 and/or the second latch 252 may be conventional latches or other kinds of latches. The reset terminal of the first latch 251 is coupled to the output terminal of the second latch 252. The reset terminal of the second latch 252 is coupled to the output terminal of the first latch 251.

In the embodiment shown in FIG. 5, the phase comparison result of the phase comparator 250 includes a first output signal A_OUT and a second output signal B_OUT. The output terminal of the first latch 251 outputs the first output signal A_OUT to the self-calibration circuit 240. The output terminal of the second latch 252 outputs the second output signal B_OUT to the self-calibration circuit 240.

In the embodiment shown in FIG. 5, the self-calibration circuit 240 includes a test pattern circuit 241 and a common-mode voltage generating circuit 242. The common-mode voltage generating circuit 242 may set the level of the common-mode voltage (i.e., the common-mode level) at the input terminal of the sensing circuit 210_1. The common-mode voltage generating circuit 242 may further set the common-mode level at the input terminal of the sensing circuit 210_2.

An output terminal of the common-mode voltage generating circuit 242 is coupled to the input terminal of the sensing circuit 210_1 to set the common-mode level of the sensing circuit 210_1. Another output terminal of the common-mode voltage generating circuit 242 is coupled to the input terminal of the sensing circuit 210_2 to set the common-mode level of the sensing circuit 210_2. During the testing period, the test pattern circuit 241 may provide the same differential signal to the sensing circuit 210_1 and the sensing circuit 210_2. The test pattern circuit 241 controls the common-mode voltage generating circuit 242 to adjust the common-mode level of the sensing circuit 210_1 and/or the common-mode level of the sensing circuit 210_2.

In the embodiment shown in FIG. 5, the common-mode voltage generating circuit 242 includes a variable resistor VR11, a variable resistor VR12, a variable resistor VR21, and a variable resistor VR22. A first terminal of the variable resistor VR11 is coupled to a first voltage V1. A second terminal of the variable resistor VR11 is coupled to the sensing circuit 210_1. A first terminal of the variable resistor VR12 is coupled to a second voltage V2. The levels of the first voltage V1 and the second voltage V2 may be determined according to design requirements. A second terminal of the variable resistor VR12 is coupled to the second terminal of the variable resistor VR11. The test pattern circuit 241 may control the voltage division ratio between the variable resistor VR11 and the variable resistor VR12 to adjust the common-mode level of the sensing circuit 210_1. A first terminal of the variable resistor VR21 is coupled to the first voltage V1. A second terminal of the variable resistor VR21 is coupled to the sensing circuit 210_2. A first terminal of the variable resistor VR22 is coupled to the second voltage V2. A second terminal of the variable resistor VR22 is coupled to the second terminal of the variable resistor VR21. The test pattern circuit 241 may also control the voltage division ratio between the variable resistor VR21 and the variable resistor VR22 to adjust the common-mode level of the sensing circuit 210_2.

Figure 6:
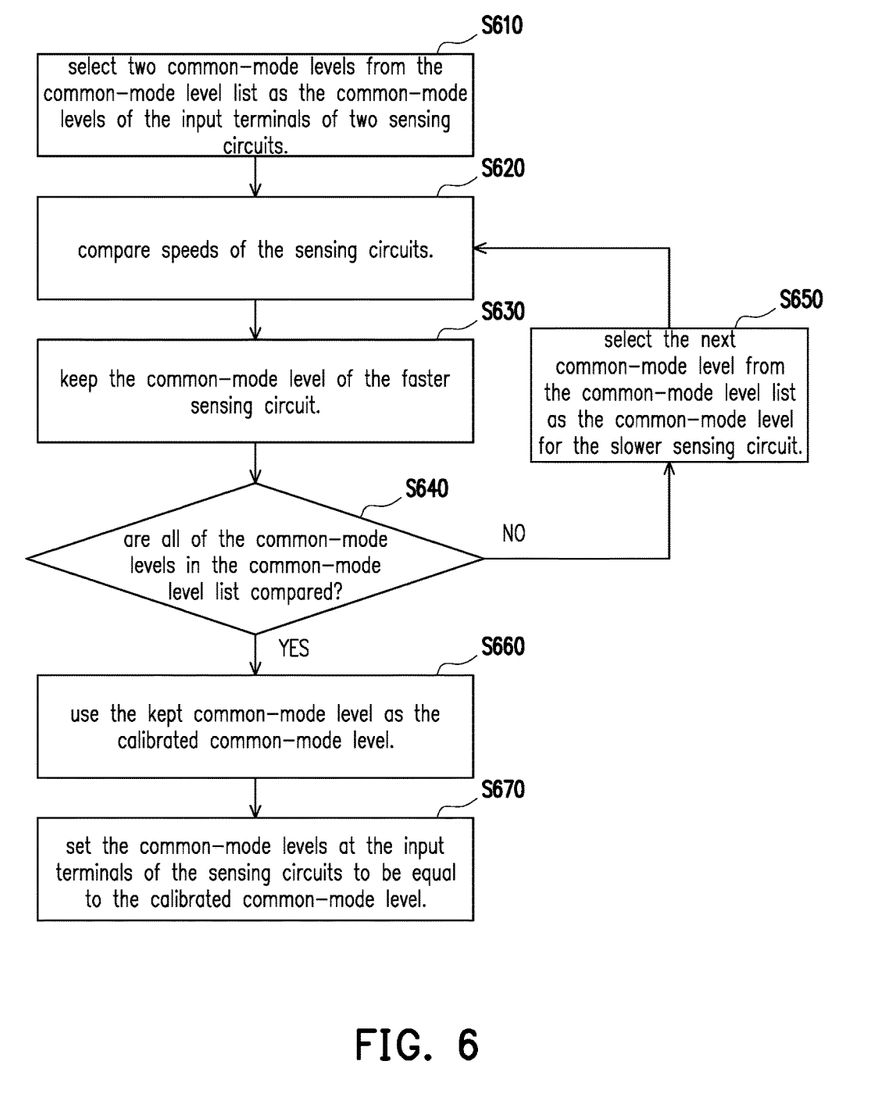
FIG. 6 is a flowchart schematically showing a common-mode voltage calibration method of a receiver according to another embodiment of the disclosure.

FIG. 6 is a flowchart schematically showing a common-mode voltage calibration method of a receiver according to another embodiment of the disclosure. With reference to FIG. 5 and FIG. 6, in step S610, a test pattern circuit 241 selects two common-mode levels from the common-mode level list as the common-mode level of the input terminal of a sensing circuit 210_1 and the common-mode level of the input terminal of a sensing circuit 210_2, respectively. In step S620, the test pattern circuit 241 provides the same differential signal to the sensing circuit 210_1 and the sensing circuit 210_2, and a phase comparator 250 compares the speed of the sensing circuit 210_1 and the speed of the sensing circuit 210_2 (i.e., compares the phase relationship of the latch results) to generate a phase comparison result to be provided to the test pattern circuit 241.

In step S630, the test pattern circuit 241 keeps the common-mode level of the sensing circuit having a faster latch speed. For example, assuming that the phase comparison result of the phase comparator 250 shows that the latch speed of the sensing circuit 210_1 is faster than the latch speed of the sensing circuit 210_2, the test pattern circuit 241 then keeps the common-mode level of the sensing circuit 210_1. When the common-mode level list still contains common-mode levels that have not been compared (the determination result in step S640 is NO), the test pattern circuit 241 then proceeds to perform step S650 to select another common-mode level from the common-mode level list as the new common-mode level for the input terminal of the slower sensing circuit (e.g., the sensing circuit 210_2). After step S650 is completed, the test pattern circuit 241 performs steps S620 to S640 again.

When the test pattern circuit 241 determines that all of the common-mode levels in the common-mode level list are compared (the determination result in step S640 is YES), the test pattern circuit 241 then proceeds to perform step S660. In step S660, the test pattern circuit 241 uses the common-mode level kept in step S630 as the calibrated common-mode level. That is, the common-mode level having the fastest latch speed in the common-mode level list is selected as the calibrated common-mode level. In step S670, the test pattern circuit 241 controls the common-mode voltage generating circuit 242 during a normal operation period so that the common-mode level of the input terminal of the sensing circuit 210_1 and the common-mode level of the input terminal of the sensing circuit 210_2 are set to be equal to the calibrated common-mode level. Therefore, the self-calibration circuit 240 may adaptively and dynamically tune the latch speeds of the sensing circuits 210_1 to 210_N shown in FIG. 2 to an optimal state.

The blocks of the self-calibration circuit 240, the test pattern circuit 241 and/or the phase comparator 250 may be implemented by a logic circuit (hardware) formed on an integrated circuit, and may also be implemented by software using a central processing unit (CPU). In the latter case, the related functions of the self-calibration circuit 240, the test pattern circuit 241 and/or the phase comparator 250 may be implemented as programming codes of software (i.e., program). The software (i.e., program) may be read by a computer (or a CPU), and may be recorded/stored in a read-only memory (ROM), a storage device (referred to as a "recording medium") and/or a random access memory (RAM). Besides, the program is read and executed from the recording medium by a computer (or a CPU), thereby achieving the related function. The recording medium may be a "non-transitory computer readable medium" such as a tape, a disk, a card, a semiconductor memory, a programmable logic circuit. Moreover, the program may also be provided to the computer (or the CPU) by any transmission medium (e.g., a communication network or a broadcasting wave). The communication network is, for example, the Internet, wired communication, wireless communication, or other communication media.

In different application contexts, the related functions of the self-calibration circuit 240, the test pattern circuit 241 and/or the phase comparator 250 may be achieved as software, firmware, or hardware by using general programming languages (e.g., C or C++), hardware description languages (e.g., Verilog HDL or VHDL), or other suitable programming languages. Regarding hardware applications, various logical blocks, modules and circuits in one or more controllers, microcontrollers, microprocessors, application-specific integrated circuits (ASIC), digital signal processors (DSP), field programmable gate arrays (FPGA) and/or other processing devices may be used to achieve or execute the functions described in the embodiments of the disclosure. In addition, the device and the method of this disclosure may be implemented by a combination of hardware, firmware and/or software.

To summarize, in the receiver and the common-mode voltage calibration method thereof according to the embodiments of the disclosure, different common-mode levels are used during the testing period to test the latch speeds of the plurality of sensing circuits 210_1 to 210_N so as to select one common-mode level having the fastest latch speed (referred to as the calibrated common-mode level) among the different common-mode levels. During the normal operation period, the receiver sets the common-mode levels of the sensing circuits 210_1 to 210_N to be equal to the calibrated common-mode level so as to accelerate the latch speeds of the sensing circuits 210_1 to 210_N.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A receiver, comprising:
a plurality of sensing circuits;
a phase comparator coupled to a plurality of output terminals of the plurality of sensing circuits to receive a plurality of signals outputted by the plurality of sensing circuits, wherein the phase comparator compares phase relationships of the plurality of signals outputted by the plurality of sensing circuits during a first time period to produce a phase comparison result; and
a self-calibration circuit coupled to the phase comparator to receive the phase comparison result and coupled to a plurality of input terminals of the plurality of sensing circuits, wherein the self-calibration circuit provides same differential signals to the plurality of input terminals of the plurality of sensing circuits during the first time period and sets common-mode levels at the plurality of input terminals of the plurality of sensing circuits to be different from one another during the first time period; the self-calibration circuit determines a calibrated common-mode level based on the phase comparison result; and the self-calibration circuit sets the common-mode levels at the plurality of input terminals of the plurality of sensing circuits to be equal to the calibrated common-mode level during a second time period.

2. The receiver as recited in claim 1, wherein the self-calibration circuit sets the common-mode levels that are different from one another at the plurality of input terminals of the plurality of sensing circuits based on a common-mode level list, and the self-calibration circuit determines the calibrated common-mode level by selecting one common-mode level from the common-mode level list based on the phase comparison result to serve as the calibrated common-mode level.

3. The receiver as recited in claim 1, wherein any one of the plurality of sensing circuits comprises:
   a differential input stage circuit having a differential input terminal that serves as the input terminal of the sensing circuit; and
   a latch circuit having at least one input terminal coupled to at least one output terminal of the differential input stage circuit, wherein at least one output terminal of the latch circuit serves as the output terminal of the sensing circuit.

4. The receiver as recited in claim 1, wherein the plurality of sensing circuits comprises a first sensing circuit and a second sensing circuit, and the phase comparator comprises:
   a first latch having an input terminal coupled to the output terminal of the first sensing circuit; and
   a second latch having an input terminal coupled to the output terminal of the second sensing circuit, wherein an output terminal of the second latch is coupled to a reset terminal of the first latch, and a reset terminal of the second latch is coupled to an output terminal of the first latch,
   wherein a signal of the output terminal of the first latch and a signal of the output terminal of the second latch are transmitted to the self-calibration circuit to serve as the phase comparison result.

5. The receiver as recited in claim 1, wherein the plurality of sensing circuits comprises a first sensing circuit, and the self-calibration circuit comprises:
   a common-mode voltage generating circuit having an output terminal coupled to the first sensing circuit to set a common-mode level of the first sensing circuit; and
   a test pattern circuit controlling the common-mode voltage generating circuit to adjust the common-mode level of the first sensing circuit.

6. The receiver as recited in claim 5, wherein the common-mode voltage generating circuit comprises:
   a first variable resistor having a first terminal coupled to a first voltage, wherein a second terminal of the first variable resistor is coupled to the first sensing circuit; and
   a second variable resistor having a first terminal coupled to a second voltage, wherein a second terminal of the second variable resistor is coupled to the second terminal of the first variable resistor,
   wherein the test pattern circuit controls a voltage division ratio between the first variable resistor and the second variable resistor to adjust the common-mode level of the first sensing circuit.

7. A common-mode voltage calibration method of a receiver, wherein the receiver comprises a plurality of sensing circuits, a self-calibration circuit and a phase comparator, the common-mode voltage calibration method comprising:
   comparing phase relationships of a plurality of signals outputted by the plurality of sensing circuits at a plurality of output terminals of the plurality of sensing circuits by the phase comparator during a first time period to produce a phase comparison result;
   providing same differential signals to a plurality of input terminals of the plurality of sensing circuits by the self-calibration circuit during the first time period;
   setting common-mode levels at the plurality of input terminals of the plurality of sensing circuits to be different from one another by the self-calibration circuit during the first time period;
   determining a calibrated common-mode level based on the phase comparison result by the self-calibration circuit; and
   setting the common-mode levels at the plurality of input terminals of the plurality of sensing circuits to be equal to the calibrated common-mode level by the self-calibration circuit during a second time period.

8. The common-mode voltage calibration method as recited in claim 7, wherein the self-calibration circuit sets the common-mode levels that are different from one another at the plurality of input terminals of the plurality of sensing circuits based on a common-mode level list, and the self-calibration circuit determines the calibrated common-mode levels by selecting a common-mode level from the common-mode level list based on the phase comparison result to serve as the calibrated common-mode level.

* * * * *